(12) United States Patent
Dupont et al.

(10) Patent No.: US 7,008,853 B1
(45) Date of Patent: Mar. 7, 2006

(54) METHOD AND SYSTEM FOR FABRICATING FREE-STANDING NANOSTRUCTURES

(75) Inventors: Audrey Dupont, Dresden (DE); Ronald Hoyer, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/066,320

(22) Filed: Feb. 25, 2005

(51) Int. Cl.
  *H01L 21/20* (2006.01)
(52) U.S. Cl. .................. 438/397; 438/254; 438/745
(58) Field of Classification Search .......... 438/254, 438/397, 745
See application file for complete search history.

(56) References Cited

U.S. PATENT DOCUMENTS

2004/0003828 A1 * 1/2004 Jackson ................ 134/1

OTHER PUBLICATIONS

Legtenberg, R. et al.., "Stiction of Surface Macromachined Structures after Rinsing and Drying: Model and Investigation of Adhesion Mechanisms", Sensors and Actuators A, 43 (1994), pp. 230-238.
Goldfarb D. et al., "Aqueous-Based Photoresist Drying Using Supercritical Carbon Dioxide to Prevent Pattern Collapse", J. Vac.Sci. Technol. B 18(6), Nov./Dec. 2000, pp. 3313-3317.

* cited by examiner

*Primary Examiner*—David Nelms
*Assistant Examiner*—Quoc Hoang
(74) *Attorney, Agent, or Firm*—Edell, Shapiro & Finnan (57) ABSTRACT

Systems and methods include introducing a semiconductor wafer into a process chamber. An etching chemistry is injected into the process chamber to etch a patterned layer and to release free-standing nanostructures on the semiconductor wafer. The etching chemistry includes a supercritical or liquid carbon dioxide fluid and an etching solution. The semiconductor wafer is rinsed by flooding a supercritical or liquid carbon dioxide fluid into the process chamber. The semiconductor wafer is dried by venting out supercritical or liquid carbon dioxide fluid from the process chamber.

32 Claims, 7 Drawing Sheets

METHOD AND SYSTEM FOR FABRICATING FREE-STANDING NANOSTRUCTURES

FIELD OF THE INVENTION

The invention relates to systems and corresponding methods for fabricating free-standing nano-structures on a semiconductor wafer. In particular, the invention relates to the field of etching, cleaning, and drying a semiconductor wafer with a patterned layer to fabricate bottom electrode structures on a semiconductor wafer and to cleaning and/or drying the bottom electrode structures.

BACKGROUND

One goal in the manufacture of integrated circuits is to continuously decrease feature sizes of the fabricated components. For certain components, like capacitors, shrinking adversely affects the properties of the component. In order to achieve a desired value of capacitance, it is therefore necessary to keep the surface area of the capacitor above a threshold value. This is particularly important for dynamic random access memory cells (DRAM) which call for high integration densities.

As the surface area for a single memory cell decreases, the capacity of the storage capacitor also decreases. For proper operation of the memory cell, a certain minimum capacity (typically on the order of about 30 femto farad) is mandatory for the storage capacitor. If the capacity of the storage capacitor is too small, the charge stored in the storage capacitor is not sufficient to produce a detectable signal. In such a case, the information stored in the memory cell is lost and the memory cell is not operating in a desired manner.

Several methods have been developed to overcome the problems associated with shrinking feature sizes by integrating capacitors of DRAM cells in a three dimensional manner. For example, one method introduces deep trench capacitors which are formed in the substrate of a semiconductor wafer to maintain a large capacitor area with a high capacity while using only a small amount of the surface of the substrate. The selection or access transistor is usually formed on the planar surface of the substrate in this method.

In another example, stacked capacitors are used which are formed on top of a planar surface on the substrate. The selection transistors are formed below the planar surface in this method. The stacked capacitor includes a first electrode and a second electrode with a dielectric layer between the two electrodes. The first electrode (also called bottom electrode) is usually formed as a cylindrical structure on the surface of the substrate by lining trenches of a patterned sacrificial mold layer with the electrode material. Afterwards, the bottom electrodes are released by etching the sacrificial mold layer. Subsequently, the surface of the bottom electrodes are cleaned to be prepared for further processing, including deposition of the dielectric layer and the second or top electrode.

However, with the ever decreasing feature sizes of structures, etching and/or cleaning steps become increasingly difficult. Etching and/or cleaning steps are usually performed by wet processing. Standard wet processing, e.g. rinsing the wafer with ultra pure de-ionized water for cleaning purposes, introduces capillary forces between neighboring structures (e.g., between adjacent bottom electrodes). With reduced feature sizes, this may lead to adhesion of neighboring structures. This is described in Legtenberg et al., "*Stiction of surface macromachined structures after rinsing and drying: model and investigation of adhesion mechanisms*", *Sensors and Actuators A,* 43 (1994), pages 230–238. Adhesion of neighboring structures is mediated by the cleaning liquid, usually referred to as "stiction".

For semiconductor processing, stiction is primarily important during drying steps which usually follow the etching and cleaning steps in semiconductor wafer processing. There, capillary forces induced by the liquid lead to adhesion of adjacent bottom electrodes. The adjacent bottom electrodes remain stuck to each other even after being completely dried, particularly when the adhesion force between the contacting adjacent bottom electrodes is larger than the elastic restoring force of the deformed bottom electrodes.

Exposing wafers to an air-liquid interface during transfer between etching, cleaning and drying process modules is detrimental to obtaining stiction free process performance. Failing to achieve stiction free process performance ultimately results in a low yield of the produced circuits. One potential solution to this problem is to completely avoid wet processing and perform etching steps using gas phase processing, e.g. in a hydrogen fluoride vapor. However, such gas phase processing leads to etching residues and to silicon surface termination states which in turn hinders further processing.

SUMMARY OF THE INVENTION

It is an object of the invention to provide a system and corresponding method for fabricating free-standing nanostructures on a semiconductor wafer which overcomes the above mentioned problems associated with stiction.

It is another object of the invention to provide such a system and method that includes etching, cleaning, and drying of a semiconductor wafer with a patterned hard mask layer for fabrication of bottom electrode structures.

The aforesaid objects are achieved individually and in combination in accordance with the present invention, and it is not intended that the present invention be construed as requiring two or more of the objects to be combined unless expressly required by the claims attached hereto.

In accordance with the invention, a method for fabricating free-standing nanostructures includes: providing a semiconductor wafer including a substrate and a patterned layer above the substrate, the patterned layer comprising a plurality of openings ranging from the surface of the patterned layer to the surface of the substrate and structural elements being arranged within the openings, providing a process chamber, the process chamber being conFig.d to accommodate the semiconductor wafer, introducing the semiconductor wafer into the process chamber, injecting an etching chemistry into the process chamber to etch the patterned layer and to release the structural elements as free-standing nanostructures on the semiconductor wafer, the etching chemistry comprising a carbon dioxide fluid and an etching solution, rinsing the semiconductor wafer by flooding a carbon dioxide fluid into the process chamber, and drying the semiconductor wafer by injecting a supercritical carbon dioxide fluid into the process chamber and by venting out the supercritical carbon dioxide fluid from the process chamber.

Accordingly, stiction free processing is achieved by employing unique properties of carbon dioxide in the supercritical or liquid state. The supercritical state is a high density phase characterized by a low viscosity and a zero surface tension, thus enabling better solubility and efficiency of the etching chemistry. On the other hand, properties similar to a gas phase presents high diffusion capabilities, allowing for easy solvent removal and greater drying efficiency. Another feature of the invention is that all process steps are performed in the same process chamber. This ensures that no air-liquid interfaces during transfer between etching, cleaning and drying process modules can occur. Accordingly, capillary forces are eliminated. This is achieved by employing carbon dioxide in its various states, i.e. supercritical, liquid and gas.

In accordance with another embodiment of the invention, a system for fabricating free-standing nanostructures comprises: a semiconductor wafer including a substrate and a patterned layer above the substrate, the patterned layer comprising a plurality of openings ranging from the surface of the patterned layer to the surface of the substrate and structural elements being arranged within the openings, a process chamber, the process chamber being conFig.d to accommodate the semiconductor wafer, means for introducing the semiconductor wafer into the process chamber, means for injecting an etching chemistry into the process chamber to etch the patterned layer and to release the structural elements as free-standing nanostructures on the semiconductor wafer, the etching chemistry comprising a liquid or supercritical carbon dioxide and an etching solution, means for rinsing the semiconductor wafer by flooding a liquid or supercritical carbon dioxide fluid into the process chamber, and means for drying the semiconductor wafer by venting out the supercritical carbon dioxide fluid from the process chamber.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Exemplary embodiments of methods and systems according to the invention are discussed in detail below. It is appreciated, however, that the present invention provides many applicable inventive concepts that can be embodied in a wide variety of specific contexts. The specific embodiments discussed are merely illustrative of specific ways to apply the method and the system of the invention, and do not limit the scope of the invention.

In particular, the following embodiments are described in the context of fabricating bottom electrode structures for stacked capacitor DRAM cells and surrounding gate transistors for a vertical cell technology. In both technologies, free-standing nanostructures are formed as protruding elements on the surface of a semiconductor wafer having, in accordance with present technologies, a height to width ratio in excess of 20. It should be noted, however, that the inventive methods and systems can be applied for other high aspect ratio nanostructures as well.

Figure 1:
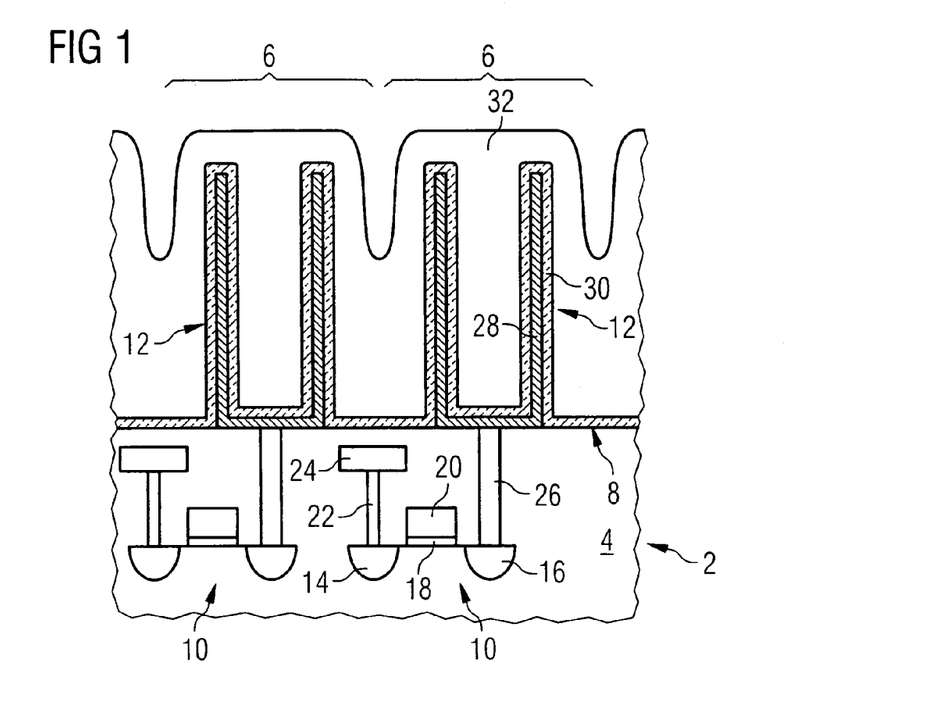
FIG. 1 depicts a side view in partial cross-section of a semiconductor wafer including a plurality of stacked capacitor DRAM-cells.

Referring to FIG. 1, stacked capacitor DRAM-cells are shown in a side view. It should be appreciated that FIG. 1 merely serves as an illustration of fabricating stacked capacitor DRAM-cells, and the individual components shown in FIG. 1 are not true to scale.

In FIG. 1, a semiconductor wafer 2 is shown including a substrate 4 of semi-conductive material (e.g., silicon). The semiconductor wafer 2 is used for fabricating a plurality of stacked capacitor DRAM cells 6. Each DRAM cell 6 includes a selection transistor 10 and a stacked capacitor 12. The stacked capacitor 12 is located above the substrate surface 8.

The transistor 10 is located in the substrate 4. The transistor 10 is formed by a first junction 14 and a second junction 16. Between the first junction 14 and the second junction 16 a gate 20 is disposed above a gate dielectric layer 18. The gate 20 can include a stack of several layers (e.g., silicon and tungsten). The stack of several layers reduces the resistance of the gate 20. The gate 20 also serves as a word line for addressing a specific DRAM cell 6 of the plurality of DRAM cells during operation.

The first junction 14 is connected to a bit-line contact 22. The bit-line contact 22 is disposed above the first junction 14. The bit-line contact 22 is connected to a bit-line 24 which is located above the bit-line contact 22. The bit-line 24 serves as a write or read line during operation.

The second junction 16 is connected to a contact plug 26. The contact plug 26 is disposed above the second junction 16. The contact plug 26 serves as a connection to a bottom electrode 28 of the capacitor 12. The bottom electrode 28 of the capacitor 12 is located above the substrate surface 8.

In FIG. 1, the bottom electrodes 28 are shown in a cross sectional side view. For the three dimensional shape of the bottom electrode 28, many different geometries can be used including cylindrical, elliptical or rectangular.

As shown in FIG. 1, the bottom electrode 28 is formed with vertical side walls above the contact plug 26. However, non-vertical side walls or side walls being laterally recessed are also conceivable.

The bottom electrode 28 of the capacitor 12 is covered by a dielectric layer 30 which serves as the dielectric of capacitor 12. Above the dielectric layer 30 a top electrode 32 is disposed. The top electrode 32 of the capacitor 12 is usually common to all DRAM cells 6 thus providing a connection between adjacent DRAM cells 6.

To a person skilled in the art, it is known that other elements might be necessary to fabricate working DRAM cells 6. For example, an insulation between adjacent transistors 10 might be necessary to avoid electrical shorts to adjacent junction regions. In addition, a barrier layer between the contact plug 26 and the bottom electrode 28 can be provided, if necessary, to eliminate diffusion of different materials.

Furthermore, an isolation material can be disposed around the contact plugs 26 to avoid shorts to adjacent DRAM cells 6. It is also possible to dispose the bit-line 24 on top of the top electrode 32 of the capacitor 12 by using a modified bit-line contact 22.

Figure 2:
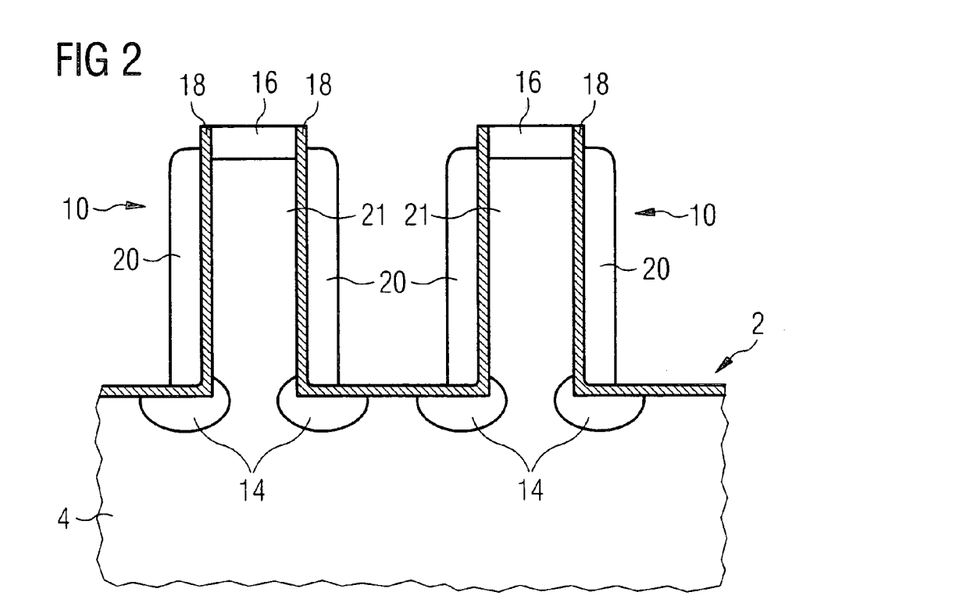
FIG. 2 depicts a side view in partial cross-section of a semiconductor wafer including a plurality of surrounding gate transistors.

Referring now to FIG. 2, a second semiconductor wafer 2 is shown including a substrate 4 of semi-conductive material (e.g., silicon). The semiconductor wafer 2 is used for fabricating a plurality of surrounding gate transistors 10.

Each transistor 10 is located on pillars 21 formed on the substrate 4, where the transistor is formed by a first junction 14 on the lower side of the pillar 21 and a second junction 16 on the top side of the pillar 21. A gate dielectric layer 18 and a gate 20 are disposed on the side walls of the pillar 21 between the first junction 14 and the second junction 16.

Figure 3A:
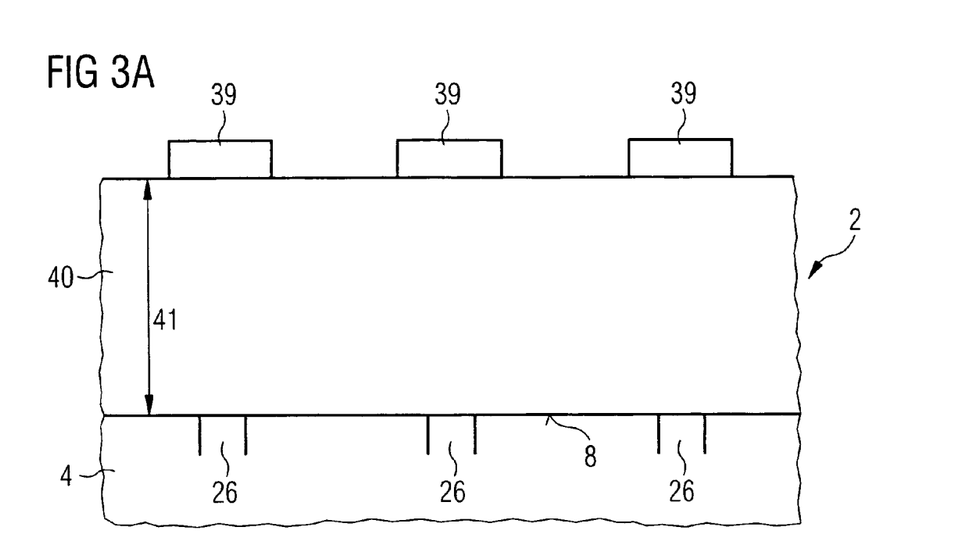
FIGS. 3A–3D depict a side view in partial cross-section of parts of a stacked capacitor DRAM-cell formed in accordance with an exemplary method of the invention.

In an exemplary method of the invention for forming DRAM cells 6 of FIG. 1, a semiconductor wafer 2 is first provided as shown in FIG. 3A. The semiconductor wafer 2 has the substrate 4, with transistors 10 in the substrate (not shown) that have been formed for each DRAM cell 6.

In FIG. 3A, contact plugs 26 are shown on the surface 8 of the substrate 4. As described above, the contact plugs 26 are used to contact the bottom electrodes with the junction regions of the transistors. The contact plugs 26 usually have a low resistance and are made of, e.g., arsenic doped amorphous silicon. As an example, in a technology providing 70 nm minimal feature size, adjacent contact plugs 26 are spaced from each other at a distance ranging from 50 nm to 200 nm.

On the surface 8 of substrate 4, a hard mask 40 as is deposited a mold layer. The hard mask 40 may be composed of, e.g. silicon oxide. The hard mask 40 serves later as a mold for the bottom electrode 28 of the stacked capacitor DRAM cell 6. Accordingly, the thickness 41 of the hard mask directly affects the height of the bottom electrode 28 to be formed and, as a consequence, the capacitance of stacked capacitor 12. Accordingly, the hard mask 40 must have a certain thickness which can be about 2 $\mu$m, e.g., for the 70 nm technology. However, other values for the thickness 41 might also be used, e.g., thicknesses in the range of 1 $\mu$m to 20 $\mu$m.

Figure 3B:
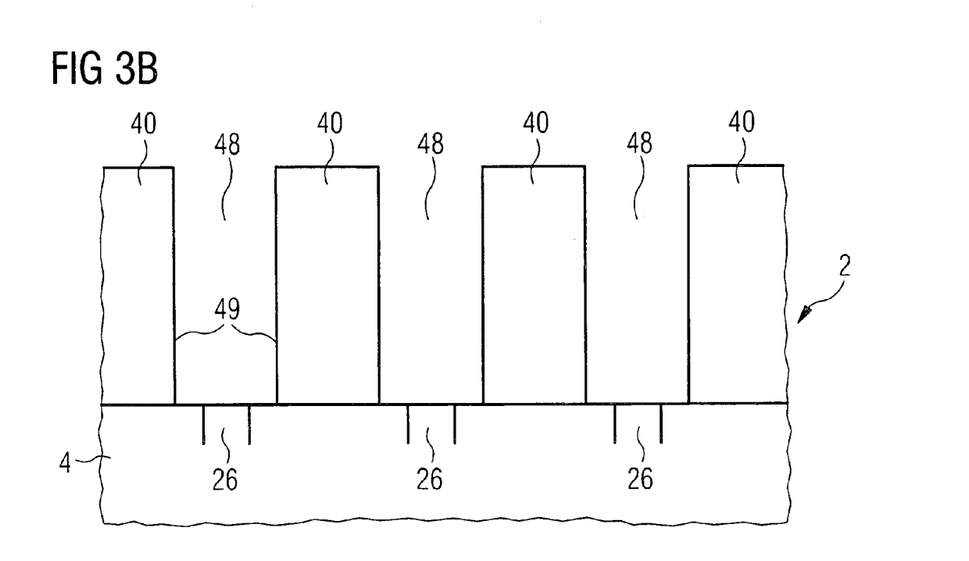

After the hard mask 40 has been deposited, a plurality of openings or trenches 48 are formed in the mask layer 40, as shown in FIG. 3B. A photo lithographic patterned resist can be applied, e.g., to define the regions of the trenches 48. Each trench 48 is arranged above a respective contact plug 26, as shown in FIG. 3B. The trenches 48 are formed using a reactive ion etching step.

During the etching step, material of the mask layer 40 is removed, thus forming the trench 48 from the top surface of the contact plugs 26. As a result, the bottom of the trenches 48 are formed by the contact plugs 26 while the side walls 49 of the trench are formed within hard mask 40. Etching of trenches 48 preferably leads to side walls 49 which have a width in the range of 50 nm to 200 nm as measured at the center of the trench 48.

Subsequently, a conductive layer 50 is conformably deposited on the semiconductor wafer 2. The conductive layer 50 covers the top side of the hard mask 40, the trench side walls 49, and the bottom part of the trench 48, (including the contact plugs 26). A suitable material for forming the conductive layer 50 by deposition can be, e.g., doped amorphous silicon. The conductive layer 50 serves later as the bottom electrode 28 of the stacked capacitor 12 of DRAM cell 6 once the hard mask 40 has been removed and the bottom electrodes are released. Therefore, the thickness of the conductive layer 50 affects the stability of the free-standing bottom electrodes 28.

Figure 3C:
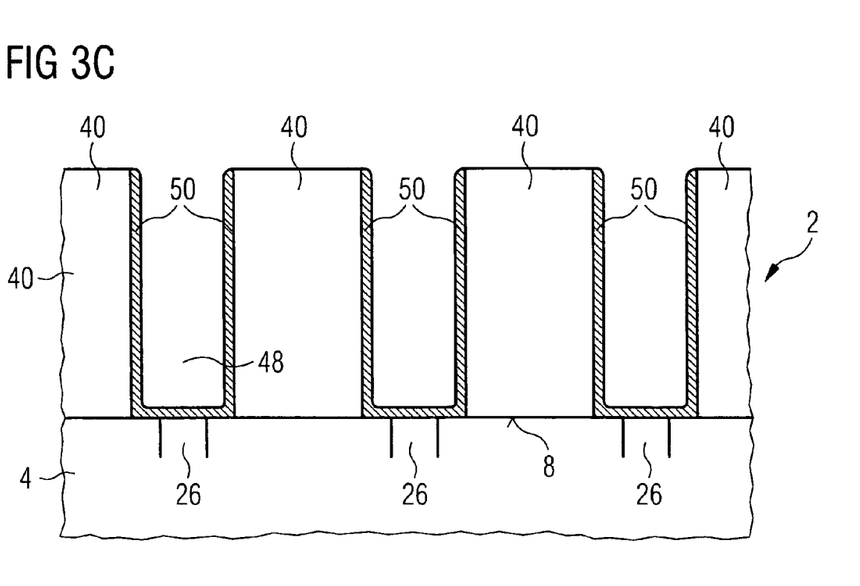

In the next process step, a portion of the conductive layer 50 is removed from the surface of the hard mask 40, as shown in FIG. 3C. This portion of the conductive layer 50 can be removed, e.g., by etching using a plasma etcher. Alternatively, the trenches 48 can be filled with a fill material, followed by removing the portion of the conductive layer 50 from the top surface of the hard mask 40 by chemical mechanical polishing, and then removing the fill material from within the trenches 48. According to these process steps, the fill material protects the inner sides of the trenches 48 from residues which could be a problem during later process steps (e.g., deposition of the dielectric layer 30).

Figure 3D:
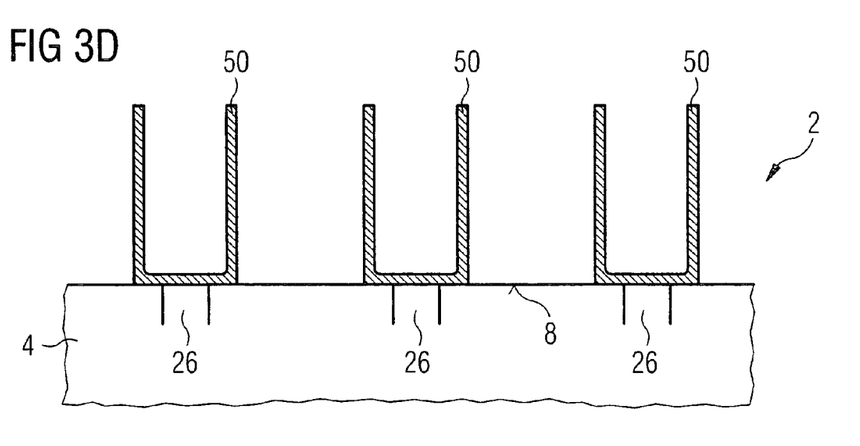

Referring to FIG. 3D, the next process step includes removing the hard mask layer 40 in order to release the remaining part of conductive layer 50 as free-standing nanostructures. The free-standing nanostructures form bottom electrodes of a stacked capacitor DRAM-cell 6, as described above and depicted in FIG. 1.

Figure 4A:
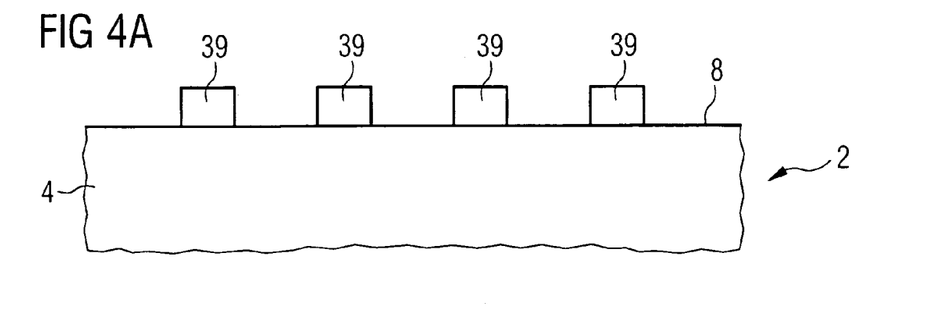
FIGS. 4A–4B depict a side view in partial cross-section of free-standing nano-structures formed in accordance with another exemplary method of the invention.
Figure 4B:
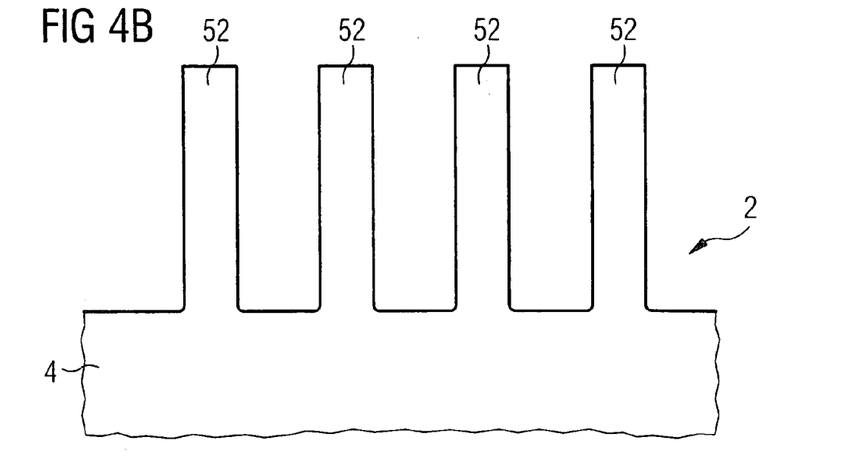

In FIGS. 4A and 4B, another process sequence of fabricating free-standing nanostructures in accordance with the invention is shown. Referring to FIG. 4A, the surface 8 of semiconductor wafer 2 is covered with a patterned resist layer or any other suitable hard mask layer which has been structured by, e.g., a photo lithographic process step. Referring to FIG. 4B, the next process step includes releasing free-standing nanostructures 52 by etching. For example, the free-standing nanostructures 52 of FIG. 4B are used as silicon pillars for surrounding gate transistors, such as the gate transistors described above and depicted in FIG. 2.

According to an embodiment of the invention, both releasing of the free-standing pillars and the bottom electrodes, as described in above methods and depicted in FIGS. 3A–3D and 4A–B, are performed by an etching step. In a first exemplary embodiment, the etching step employs an etching chemistry with a carbon dioxide fluid being in the liquid phase and an etching solution. The carbon dioxide fluid acts as a carrier for an etching solution which is chosen with respect to the material to be removed during the etching step. Referring to the embodiment shown in FIG. 3C, the mold layer can be composed of silicon-dioxide, such that a fluorine based etching chemistry (e.g., a formulation of a hydrofluoric acid) can be used to etch the mold layer.

In addition, the etching chemistry is a mixture of carbon dioxide, the etching solution and a co-solvent. For the co-solvent, an alcohol/de-ionized water-mixture can be chosen, but alcohol, alkane, ketone, amine or fluorine containing mixtures can be used as well. Suitable substances are specified below.

Furthermore, a surfactant can be incorporated in the etching chemistry in order to enhance water incorporation. The surfactant should be compatible with the carbon dioxide fluid. Again, suitable substances are specified below.

In a second exemplary embodiment, the process steps to release the free-standing structures are performed by an etching step mediated by a supercritical carbon dioxide fluid. In general, a supercritical fluid are compounds above the so-called critical point in the pressure/temperature phase diagram at a certain critical temperature and critical pressure. The supercritical state is often called the fourth state of matter. Supercritical fluids exhibit properties of both liquids and fluids. For example, transport properties like viscosity are similar to gases while solvating properties like density are similar to those of liquids.

Figure 5:
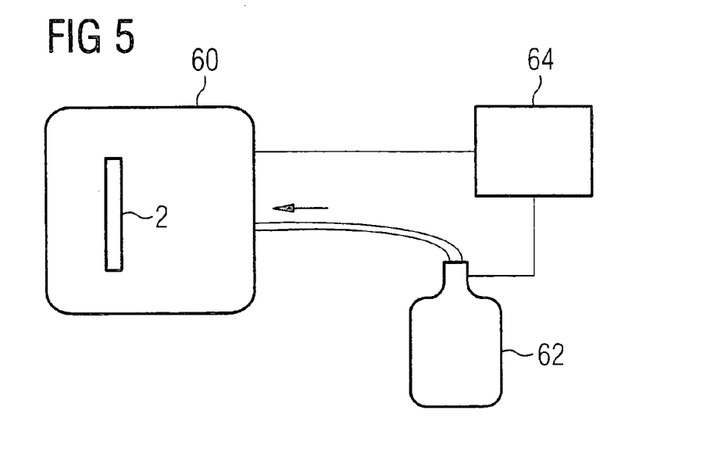
FIG. 5 depicts a side view in partial cross-section of a wafer drying, rinsing and cleaning system in accordance with the invention.

According to an embodiment of the invention, a system is provided, as shown in FIG. 5, that includes a process chamber 60. The process chamber 60 is configured (e.g., suitably dimensioned) to accommodate the semiconductor wafer 2. As shown in FIG. 5, the process chamber 60 is connected to a reservoir 62 capable of delivering carbon dioxide in the supercritical phase. In addition, the system shown in FIG. 5 allows for adding extra substances with controlled concentrations, such as etching agents and/or co-solvents, as described below. Furthermore, the process chamber 60 can be pressurized and is operated with a controlled temperature. This is achieved by a control unit 64, which is schematically connected to reservoir 62 and process chamber 60.

For the supercritical fluid system shown in FIG. 5 many commercially available systems can be used. As an example, TELSSI, Inc. and SC Fluids Inc. provide supercritical fluid tools. Tools from other vendors might be used as well.

Before processing is started, the semiconductor wafer 2 is introduced into the process chamber 60. In the next step, an etching chemistry is injected into the process chamber 60. The etching chemistry is used to etch the hard mask layer 40 and to release the structural elements 52 as free-standing nanostructures on the semiconductor wafer 2. The etching chemistry includes the supercritical or liquid carbon dioxide fluid and an etching solution. The etching solution is chosen with respect to the material to be removed during the etching step. According to the embodiment shown in FIG. 3C, the hard mask layer 40 or mold layer is composed of silicon-dioxide. Accordingly, a fluorine based etching chemistry might be used.

The etching chemistry can be a formulation of a hydrofluoric acid in mixture of carbon dioxide and a co-solvent. Preferably, the hydrofluoric acid is added to the etching chemistry on the level of a few micro-liter per liter of the etching chemistry.

For the co-solvent, an alcohol/de-ionized water-mixture can be chosen, but alcohol, alkane (e.g., hexane), ketone (e.g., acetone), amine and/or fluorine containing mixtures can be used as well. Suitable alcohol substances include methanol, ethanol, propanol, iso-propanol, butanol and/or pentanol. Suitable amine substances include n-methylpyrrolidone, di-glycol amine, di-isopropyl amine and/or tri-isopropyl amine.

Suitable fluorine containing substances include ammonium fluoride and/or 1,1,1-fluoro methane.

In addition, a surfactant can be incorporated in the etching chemistry in order to enhance water incorporation. The surfactant should be compatible with the supercritical carbon dioxide fluid. An anionic surfactant as aerosol-OT or aerosol-OT derivatives and/or a non-ionic surfactant can be used. Suitable non-ionic surfactants include ethylene oxide and/or any one or combination of those commercially available compounds, and their derivatives, corresponding with the following trademarks: TRITON, SURFYNOL and DYNOL.

The etching chemistry containing the supercritical carbon dioxide fluid and the etching solution is injected at a temperature and pressure above the critical point of carbon dioxide, which is located above about 34° C. and about 1050 psi in the phase diagram.

Preferably, the etching chemistry is injected into the process chamber 60 at a single transparent phase in a temperature and pressure range selected between 50° C. and 100° C. and at about 1100 psi. In this temperature and pressure range, the density of the supercritical carbon dioxide fluid is in the range between 0.4 and 0.8 g/mL (g/mL=gram/milliliter). The supercritical state is further characterized by a low viscosity and negligible zero surface tension.

When injecting the etching chemistry in the process chamber, the semiconductor wafer 2 is etched. As a result, the mold layer 40 is completely removed from the surface 8 of the semiconductor wafer 2. The bottom electrodes 28 are released as free-standing nanostructures 52 on the surface 8 of the semiconductor wafer 2.

It should be noted, that the same process chamber can be used for processing the non-supercritical liquid carbon dioxide fluid as described above by selecting proper processing conditions, i.e. a temperature and pressure below the critical point of carbon dioxide.

In order to remove etching residues, the semiconductor wafer 2 is rinsed in the next step. This is achieved by flooding a supercritical carbon dioxide fluid into the process chamber 60. Flooding is performed with a controlled gradient of flow of the supercritical carbon dioxide fluid which ensures that the etching chemistry is progressively removed from the reaction mixture.

After the rinse step, an optional flushing of the free-standing nanostructures is performed within the process chamber 60. Again, a supercritical carbon dioxide fluid is used. The flow of the supercritical carbon dioxide fluid is selected in the range from 0.1 L/min to 5 L/min, preferably between 0.5 L/min and 2 L/min (L/min=liters per minute). Again, both the rinse step and the flushing step can also be performed with non-supercritical liquid carbon dioxide fluid. Preferably, the same process chamber 60 is used for performing the etching, rinse and flushing steps by selecting proper processing conditions, i.e. a temperature and pressure above or below the critical point of the carbon dioxide fluid.

Afterwards a drying step of the semiconductor wafer is performed. This is achieved by venting out supercritical or liquid carbon dioxide fluid from the process chamber 60. During this step the pressure created by the venting supercritical carbon dioxide fluid within the process chamber is released. Since the supercritical carbon dioxide fluid has negligible surface tension properties, capillary forces do not occur during drying. Accordingly, the process sequence according to this embodiment of the invention is free of stiction.

According to the embodiment of the invention, stiction free processing is achieved by employing unique properties of carbon dioxide in the supercritical state and/or liquid state. The supercritical state is a high density phase characterized by a low viscosity and a zero surface tension, thus enabling better solubility and efficiency of the etching chemistry. On the other hand, the gas phase presents high diffusion capabilities, allowing for easy solvent removal and greater drying efficiency. Another feature of the embodiment of the invention is that the process is run entirely in the same process chamber 60, ensuring that the nanostructures remain permanently wetted, and thus eliminating all together capillary forces. This is possible by making good use of the carbon dioxide various states, i.e. supercritical, liquid and gas. The process sequence according to the invention also offers additional advantages as carbon dioxide is a non-flammable and non-toxic substance and can easily be recycled.

Accordingly, problems encountered in the prior art with respect to high aspect ratio nanostructures are circumvented, as shown below.

Figure 6A:
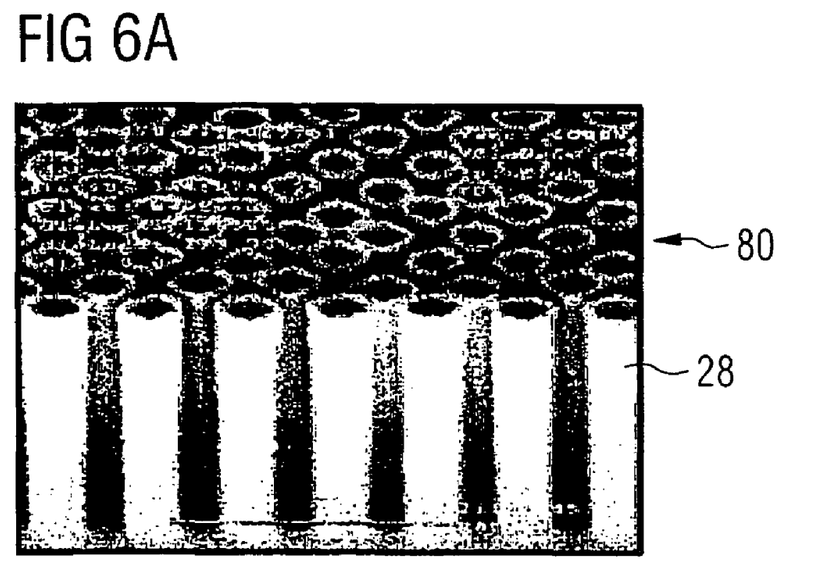
FIGS. 6A–6B are images showing a plurality of bottom electrodes of stacked capacitor DRAM-cells formed according to conventional wet etching techniques.
Figure 6B:
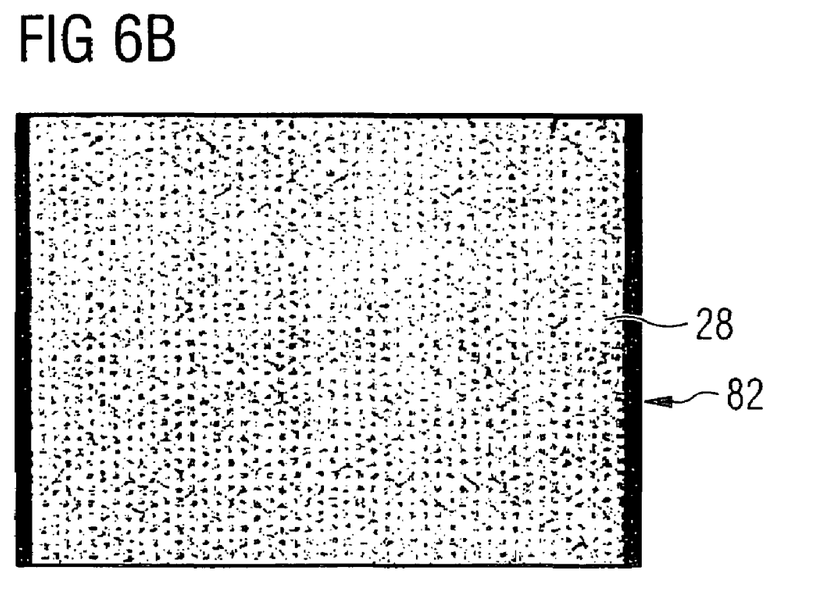

Referring now to FIGS. 6A and 6B, bottom electrodes 28 of stacked capacitor DRAM-cells are shown which are fabricated by applying prior art wet etching and drying techniques. In FIG. 6A, a first SEM-picture 80 shows bottom electrodes 28 of stacked capacitor DRAM-cells in a side view. In FIG. 6B, a second SEM-picture 82 shows bottom electrodes 28 of stacked capacitor DRAM-cells in a top view. Stiction between the neighboring cylinders of bottom electrodes 28 is clearly visible in the first SEM-picture 80 and in the second SEM-picture 82.

Figure 7:
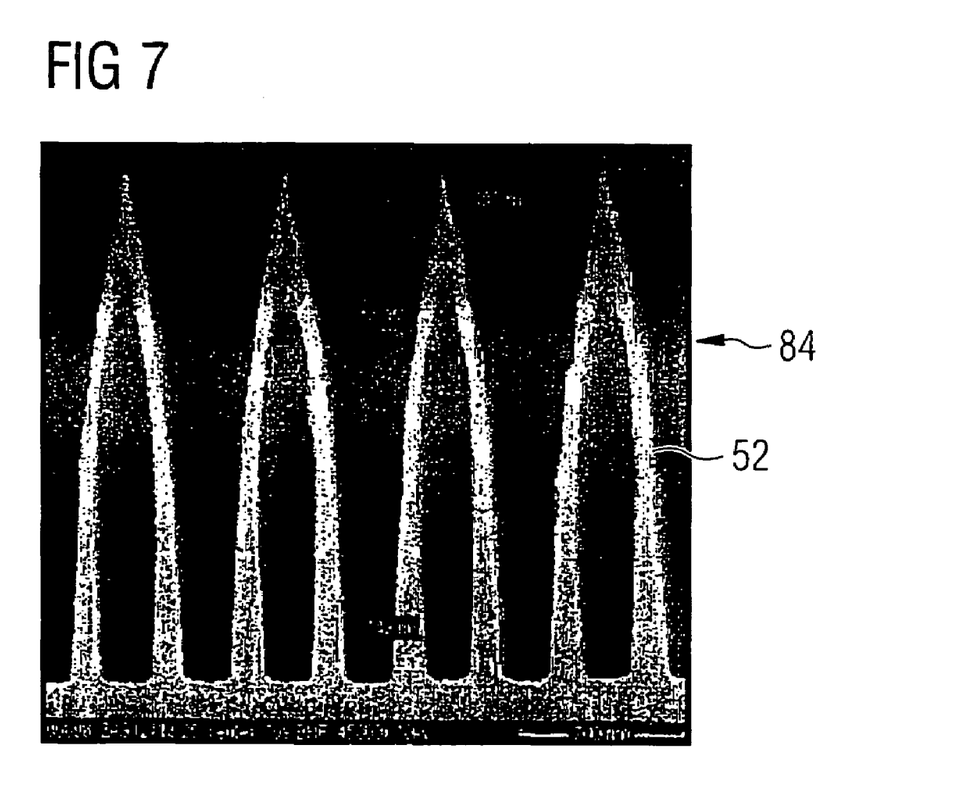
FIG. 7 is an image showing parts of a plurality of surrounding gate transistors formed according to conventional wet etching techniques.

Referring now to FIG. 7, free-standing nanostructures 52 of surrounding gate transistors are shown which are fabricated by applying prior art wet etching and drying techniques. In FIG. 7, a third SEM-picture 84 shows nanostructures 52 in a side view. Stiction between the neighboring nanostructures 52 is clearly visible in the third SEM-picture 84.

Figure 8:
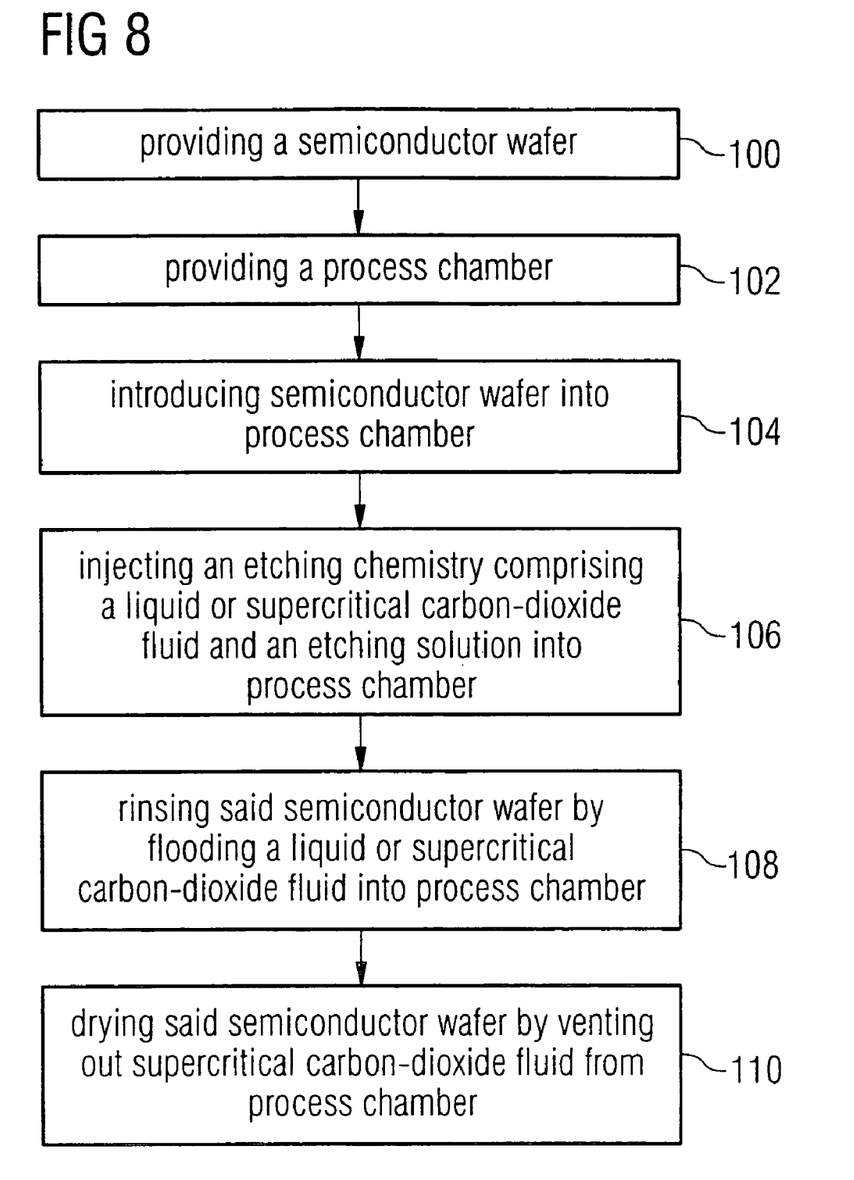
FIG. 8 is a flow chart of method steps for a further embodiment of the invention.

Referring now to FIG. 8, a flowchart of method steps is provided for utilizing the system of FIG. 5. Referring to the flowchart, a semiconductor wafer 2 is provided in step 100. In step 102, a process chamber 60 is provided, which is configured to accommodate the semiconductor wafer 2. In step 104, the semiconductor wafer 2 is introduced into the process chamber 60. In step 106, an etching chemistry is injected into the process chamber 60 to etch the patterned layer 40 and to release free-standing nanostructures on the semiconductor wafer 2. The etching chemistry includes a supercritical or liquid carbon dioxide fluid and an etching solution. In step 108, the semiconductor wafer is rinsed by flooding a supercritical or liquid carbon dioxide fluid into the process chamber 60. In step 110, the semiconductor wafer 2 is dried by injecting a supercritical carbon dioxide fluid into the process chamber 60 and by venting out the supercritical carbon dioxide fluid from the process chamber 60.

Having described embodiments for a method and a system for fabricating free-standing semiconductor structures, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equivalents.

| Reference numerals: | |
|---|---|
| 2 | wafer |
| 4 | substrate |
| 6 | DRAM cell |
| 8 | substrate surface |
| 10 | transistor |
| 12 | capacitor |
| 14 | first junction |
| 16 | second junction |
| 18 | gate dielectric layer |
| 19 | pillar |
| 20 | gate |
| 22 | bitline contact |
| 24 | bitline |
| 26 | contact plug |
| 28 | bottom electrode |
| 30 | dielectric layer |
| 32 | top electrode |
| 40 | hard mask |
| 41 | width of hard mask |
| 48 | trench |
| 49 | trench sidewall |
| 50 | conductive layer |

-continued

| Reference numerals: | |
|---|---|
| 52 | free-standing nano-structures |
| 60 | process chamber |
| 62 | reservoir |
| 64 | control unit |
| 80 | first SEM picture |
| 82 | second SEM picture |
| 84 | third SEM picture |
| 100–110 | process steps |

What is claimed is:

1. A method for fabricating free-standing nanostructures, comprising:

providing a semiconductor wafer comprising a substrate and a patterned layer above the substrate, the patterned layer comprising a plurality of openings extending from an upper surface of the patterned layer to an upper surface of the substrate, and structural elements being arranged within the openings;

providing a process chamber, the process chamber being configured to receive the semiconductor wafer;

introducing the semiconductor wafer into the process chamber;

injecting an etching chemistry into the process chamber to etch the patterned layer and to release the structural elements as free-standing nanostructures on the semiconductor wafer, the etching chemistry comprising a carbon dioxide fluid and an etching solution;

rinsing the semiconductor wafer by flooding a carbon dioxide fluid into the process chamber; and drying the semiconductor wafer by injecting a supercritical carbon dioxide fluid into the process chamber and by venting out the supercritical carbon dioxide fluid from the process chamber.

2. The method of claim 1, wherein the carbon dioxide fluid is in a liquid state in the etching chemistry injected into the process chamber.

3. The method of claim 1, wherein the carbon dioxide fluid is in a supercritical state in the etching chemistry injected into the process chamber.

4. The method of claim 3, wherein the injection of the supercritical carbon dioxide fluid containing etching chemistry into the process chamber is performed at a single transparent phase of the supercritical carbon dioxide fluid.

5. The method of claim 4, wherein the step of injecting the etching chemistry into the process chamber is performed at a pressure of the supercritical carbon dioxide fluid within the process chamber being above 1000 psi.

6. The method of claim 5, wherein the step of injecting the etching chemistry into the process chamber is performed at a temperature of the supercritical carbon dioxide fluid within the process chamber being above 40° C.

7. The method of claim 1, wherein the carbon dioxide fluid is in a liquid state during the rinsing of the semiconductor wafer.

8. The method of claim 1, wherein the carbon dioxide fluid is in a supercritical state during the rinsing of the semiconductor wafer.

9. The method of claim 8, wherein the rinsing of the semiconductor wafer is performed at constant pressure and constant temperature of the supercritical carbon dioxide fluid within the process chamber.

10. The method of claim 1, wherein the step of drying the semiconductor wafer further includes releasing the pressure created by the venting supercritical carbon dioxide fluid within the process chamber.

11. The method of claim 1, wherein, prior to the step of drying the semiconductor wafer, the method further comprises:
flushing the free-standing nanostructures with a supercritical carbon dioxide fluid at flow ranging from 0.1 L/min to 5 L/min.

12. The method of claim 1, wherein adjacent openings of the plurality of openings of the semiconductor wafer are spaced at a distance of about 200 nm or less.

13. The method of claim 12, wherein the patterned layer of the semiconductor wafer has a thickness in the range of 1 $\mu$m to 20 $\mu$m.

14. The method of claim 13, wherein openings of the plurality of openings of the semiconductor wafer have a width of about 200 nm or less.

15. The method of claim 14, wherein the step of providing a semiconductor wafer further comprises:
forming the patterned layer by depositing a mold layer on the upper surface of the substrate;
etching a plurality of openings into the mold layer, each of the openings including side-walls extending from the surface of the mold layer to the surface of the substrate; and
forming the structural elements by conformably depositing a liner layer on the semiconductor wafer, the liner layer covering at least the side-walls of the openings.

16. The method of claim 14, wherein the structural elements of the semiconductor wafer fill the openings up to the upper surface of the patterned layer and employ an etching rate with respect to the etching chemistry that is lower in comparison to the etching rate of the patterned layer.

17. The method of claim 16, wherein the patterned layer of the semiconductor wafer comprises one of silicon oxide and silicate glass.

18. The method of claim 17, wherein the etching solution in the injection of etching chemistry into the process chamber comprises hydrofluoric acid containing chemistry.

19. The method of claim 18, wherein the etching chemistry in the injection of etching chemistry into the process chamber further comprises a co-solvent.

20. The method of claim 19, wherein the co-solvent is selected from the group consisting of alcohol, alkane, ketone, amine, fluorine containing mixtures, and alcohol/de-ionized water-mixtures.

21. The method of claim 19, wherein the co-solvent comprises an alcohol selected from the group comprising methanol, ethanol, propanol, iso-propanol, butanol, and pentanol.

22. The method of claim 19, wherein the co-solvent comprises an alkane.

23. The method of claim 19, wherein the co-solvent comprises a ketone.

24. The method of claim 19, wherein the co-solvent comprises an amine selected from the group consisting of n-methylpyrrolidone, di-glycol amine, di-isopropyl amine, and tri-isopropyl amine.

25. The method of claim 19, wherein the co-solvent comprises a fluorine containing substance selected from the group consisting of ammonium fluoride, 1,1,1-fluoro methane, and mixtures thereof.

26. The method of claim 17, wherein the etching chemistry in the injection of etching chemistry into the process chamber further comprises one of an anionic surfactant and a non-ionic surfactant.

27. The method of claim 26, wherein the anionic surfactant comprises one of an aerosol-OT and an aerosol-OT derivative.

28. The method of claim 26, wherein the non-ionic surfactant is selected from the group consisting of TRITON, TRITON derivatives, SURFYNOL, SURFYNOL derivatives, DYNOL, DYNOL derivatives, and ethylene oxide.

29. A system for fabricating free-standing nanostructures, comprising:
a semiconductor wafer comprising a substrate and a patterned layer disposed above the substrate, the patterned layer comprising a plurality of openings extending from the surface of the patterned layer to the surface of the substrate and structural elements being arranged within the openings;
a process chamber, the process chamber being configured to receive the semiconductor wafer;
means for introducing the semiconductor wafer into the process chamber;
means for injecting an etching chemistry into the process chamber to etch the patterned layer and to release the structural elements as free-standing nanostructures on the semiconductor wafer, the etching chemistry comprising a liquid or supercritical carbon dioxide fluid and an etching solution;
means for rinsing the semiconductor wafer by flooding a liquid or supercritical carbon dioxide fluid into the process chamber; and
means for drying the semiconductor wafer by venting out supercritical carbon dioxide fluid from the process chamber.

30. The system of claim 29, wherein at least part of the free-standing nanostructures have a height-to-width-ratio of 20 or larger.

31. The system of claim 30, wherein the free-standing nanostructures are aligned with respect to each other and the substrate to facilitate forming of bottom electrodes of a stacked capacitor memory cell.

32. The system of claim 30, wherein the free-standing nanostructures are aligned with respect to each other and the substrate to facilitate forming of active transistors of a surrounding gate transistor.

* * * * *